(12) United States Patent
Kobayashi et al.

(10) Patent No.: US 10,884,064 B2
(45) Date of Patent: Jan. 5, 2021

(54) INSPECTION APPARATUS OF ELECTRICAL STORAGE DEVICE

(71) Applicant: TOYOTA JIDOSHA KABUSHIKI KAISHA, Toyota (JP)

(72) Inventors: Kiwamu Kobayashi, Anjo (JP); Takeshi Goto, Kasugai (JP)

(73) Assignee: TOYOTA JIDOSHA KABUSHIKT KAISHA, Toyota (JP)

( * ) Notice: Subject to any disclaimer, the term of this patent is extended or adjusted under 35 U.S.C. 154(b) by 199 days.

(21) Appl. No.: 16/238,100

(22) Filed: Jan. 2, 2019

(65) Prior Publication Data

US 2019/0250216 A1    Aug. 15, 2019

(30) Foreign Application Priority Data

Feb. 9, 2018  (JP) .................. 2018-021842

(51) Int. Cl.
*G01R 31/3842* (2019.01)
*G01R 31/392* (2019.01)
*G01R 31/389* (2019.01)

(52) U.S. Cl.
CPC ....... *G01R 31/3842* (2019.01); *G01R 31/389* (2019.01); *G01R 31/392* (2019.01)

(58) Field of Classification Search
CPC .. G01R 31/3842; G01R 31/36; G01R 31/382; G01R 31/3828; G01R 31/3835; G01R 31/385; G01R 31/386; G01R 31/389; G01R 31/392; G01R 31/3644; G01R 31/3865; H01M 10/4285; H01M 10/48
See application file for complete search history.

(56) References Cited

U.S. PATENT DOCUMENTS

2018/0164363 A1*  6/2018  Brorein ................. G01R 31/52
2019/0056457 A1*  2/2019  Li ......................... H02J 7/0021

FOREIGN PATENT DOCUMENTS

| JP | 2010-153275 A | 7/2010 |
| JP | 2016-91872 A | 5/2016 |
| KR | 10-2011-0026052 A | 3/2011 |
| KR | 10-2013-0009650 A | 1/2013 |

OTHER PUBLICATIONS

U.S. Appl. No. 16/013,421, Kiwamu Kobayashi et al., filed Jun. 20, 2018.

* cited by examiner

*Primary Examiner* — Jay Patidar
(74) *Attorney, Agent, or Firm* — Sughrue Mion, PLLC

(57) ABSTRACT

An inspection apparatus including the power supply device, positive and negative conductive lines, connected to the power supply device and having corresponding first and second probes, at corresponding front ends, a resistor and a switch serially disposed between the positive conductive line and the negative conductive line, a circuit resistance calculation unit that calculates a circuit resistance value based on a difference in voltage between when the switch is turned off and turned on, an inspection unit configured to inspect the electrical storage device, and a virtual resistance setting unit that increases the output voltage after the start of inspection.

5 Claims, 7 Drawing Sheets

INSPECTION APPARATUS OF ELECTRICAL STORAGE DEVICE

INCORPORATION BY REFERENCE

The disclosure of Japanese Patent Application No. 2018-021842 filed on Feb. 9, 2018 including the specification, drawings and abstract is incorporated herein by reference in its entirety.

BACKGROUND

1. Technical Field

The present disclosure relates to inspection apparatuses that determine the quality of an electrical storage device. More particularly, the present disclosure relates to an inspection apparatus of an electrical storage device based on a discharge current amount instead of a voltage drop amount of the electrical storage device.

2. Description of Related Art

A variety of inspection techniques have conventionally been proposed for determining the quality of secondary batteries and other electrical storage devices. For example, in Japanese Patent Application Publication No. 2010-153275, a retention step of retaining a secondary battery, that is a determination target, in a pressurized state is performed, and a battery voltage is measured before and after the retention step. A difference in the battery voltage before and after the retention step is exactly a voltage drop amount caused by retention. A battery having a large voltage drop amount means that the battery has a large self-discharge amount. Accordingly, the quality of the secondary battery can be determined based on the size of the voltage drop amount.

SUMMARY

However, the conventional quality determination of the secondary battery has following problems. That is, the quality determination takes time. The reason why the quality determination takes time is that a long retention time is needed in the retention step in order to attain a voltage drop amount large enough to be significant. This may be attributed to contact resistance in voltage measurement. To measure the voltage, a measuring instrument is connected across both the terminals of a secondary battery. In that case, a contact resistance is unavoidably generated between the terminals of the secondary battery and the terminals of the measuring instrument, so that the result of a measurement is influenced by the contact resistance. Whenever the terminals of the secondary battery and the terminals of the measuring instrument are connected, a different contact resistance is generated. Accordingly, unless the voltage drop amount itself is sufficiently large, variation in contact resistance in each measurement is not negligible.

Furthermore, the accuracy of voltage measurement itself is not very high. This is because the voltage measurement is inevitably influenced by voltage drop in an electric current path at the time of the measurement. Moreover, since a contact place between the terminals of the secondary battery side and the terminals of the measuring instrument side is different to some extent every time the connection is made, the level of a voltage drop also varies every time the voltage measurement is performed. Accordingly, it may be considered to use current measurement instead of voltage measurement to shorten a measurement time of a self-discharge amount, and to thereby enhance the measurement accuracy. Unlike the voltage measurement, the current measurement is hardly influenced by the contact place since current is constant anywhere within a circuit. However, simply replacing the voltage measurement with the current measurement does not achieve satisfactory determination in a short time. This is because the result of measurement is influenced by variation in various conditions, such as a charge voltage and measurement environments of a secondary battery.

The present disclosure provides an inspection apparatus of an electrical storage device that can swiftly determine the quality of an electrical storage device regardless of variation in conditions.

An inspection apparatus of an electrical storage device in a first aspect of the present disclosure relates to a device that inspects the amount of a self-discharge electric current of the electrical storage device in accordance with a converging state of a circuit electric current flowing through a circuit constituted by connecting the electrical storage device and an external power supply. The inspection apparatus includes: a power supply device; a positive conductive line; a negative conductive line; a resistance path; a circuit resistance calculation unit; an inspection unit; and a virtual resistance setting unit. The power supply device is configured to function as an external power supply. The positive conductive line is connected to a positive electrode terminal of the power supply device to constitute part of the circuit, the positive conductive line having a first probe provided at a front end of the positive conductive line to have a contact with the electrical storage device. The negative conductive line is connected to a negative electrode terminal of the power supply device to constitute part of the circuit, the negative conductive line having a second probe provided at a front end of the negative conductive line to have a contact with the electrical storage device. The resistance path is configured by serially connecting a resistor and a switch. The resistance path is disposed between the positive conductive line and the negative conductive line. The circuit resistance calculation unit is configured to calculate a circuit resistance value of the circuit based on a difference in voltage across the positive conductive line and the negative conductive line between when the switch is turned off and when the switch is turned on, in the state where the circuit is constituted by contacting the first probe and the second probe with the positive electrode terminal and the negative electrode terminal of the electrical storage device to be examined, respectively. The inspection unit is configured to inspect the electrical storage device while increasing an output voltage of the power supply device in a state where the circuit is constituted and the switch is turned off. The virtual resistance setting unit is configured to increase the output voltage of the power supply device after the start of inspection, within a range where a sum of a virtual resistance value and the circuit resistance value is greater than zero, the virtual resistance value being a negative value obtained by converting an increment of the electric current, related to an increased part of the output voltage of the power supply device when the inspection unit performs the inspection, into a decrement of resistance of the circuit.

In the inspection apparatus in the above aspect, the size of the circuit current after convergence, in the circuit constituted by reversely connecting the electrical storage device and the external power supply, is used as an inspection index of the quality of the electrical storage device. In the present aspect in particular, in order to converge the circuit current early, the concept of a negative value that is a virtual resistance value is introduced to increase the output voltage of the power supply device after the start of inspection. Here, if the output voltage increases too gradually after the start of inspection, it is difficult to obtain a sufficient converging effect. If the output voltage increases too steeply, the circuit current may diverge and fail to converge. Hence, in the present aspect, increase in the output voltage is simulated with a model in which the virtual resistance that takes a negative value is disposed in series with a circuit resistance (including the contact resistance of the probes), and an absolute value of the resistance value of the virtual resistance is made to grow larger. In this way, the circuit current converges without diverging unless the sum (pseudo parasitic resistance) of the virtual resistance and the circuit resistance becomes zero or negative.

In order to converge the circuit current as early as possible in this configuration, the sum of the virtual resistance and the circuit resistance needs to decrease as much as possible. If the circuit resistance is measured with high accuracy, it is possible to eliminate the risk of divergence and to set the pseudo parasitic resistance as small as possible (virtual resistance setting unit). When self-discharge is inspected in such setting, reduction of inspection time can be achieved. Accordingly, in the present aspect, a circuit resistance value is calculated with use of the resistance path and the circuit resistance calculation unit. Since the circuit resistance value calculated in this way is highly accurate, a large absolute value of the virtual resistance (close to the circuit resistance value) can be set, and therefore inspection can be performed in a short time.

The inspection apparatus of the first aspect may include a second switch; and a sub-resistance calculation unit. The second switch may be provided between the resistance path in the positive conductive line and the first probe or between the negative conductive line and the second probe. The sub-resistance calculation unit may be configured to calculate a sub-resistance value that is a resistance value of a portion constituted of the resistance path, the power supply device, the positive conductive line, and the negative conductive line in the circuit, based on the difference in voltage across the positive conductive line and the negative conductive line between when the switch (first switch) is turned off and when the switch (first switch) is turned on in the state where the second switch is turned off. The circuit resistance calculation unit may be configured to add the sub-resistance value when calculating the circuit resistance value. In this way, the sub-resistance value may also be calculated with high accuracy. A circuit resistance value with higher accuracy may be calculated by adding the sub-resistance value. Hence, it is possible to set such that the inspection is performed in a shorter time.

In the inspection apparatus in any one of the first aspect, the virtual resistance setting unit may be configured to set the virtual resistance value such that an absolute value of the virtual resistance value does not exceed the circuit resistance value, and change the output voltage of the power supply device to a voltage obtained by adding the voltage of the electrical storage device to a value obtained by multiplying the sum of the virtual resistance value and the circuit resistance value by the electric current after the start of the inspection. In this way, it is possible to keep the pseudo parasitic resistance from becoming zero or negative, while increasing the output voltage, and to thereby inspect self-discharge in a short time.

The inspection apparatus in any one of the first aspect may include a variable resistance setting unit. The variable resistance setting unit is configured to set a resistance value of the resistor to be larger when a storage capacity of the electrical storage device to be inspected is smaller, and set the resistance value to be smaller when the storage capacity is larger. This makes it possible to optimize calculation accuracy itself of the circuit resistance value. Since the circuit resistance value measured in this way has high accuracy, the inspection time can further be shortened.

In the inspection apparatus of the first aspect where the variable resistance setting unit is used, the virtual resistance setting unit may be configured to increase the output voltage of the power supply device after the start of the inspection such that an absolute value of the virtual resistance value is set to be smaller when the resistance value of the resistor set by the variable resistance setting unit is smaller, and the absolute value of the virtual resistance value is set to be larger when the resistance value of the resistor is larger. As the resistance value of the variable resistor is smaller, the accuracy of the circuit resistance value to be measured is larger. Hence, as the resistance value of the variable resistor is smaller, the inspection is performed in a shorter time.

The present configuration provides an inspection apparatus of an electrical storage device that can swiftly determine the quality of the electrical storage device regardless of variation in conditions.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
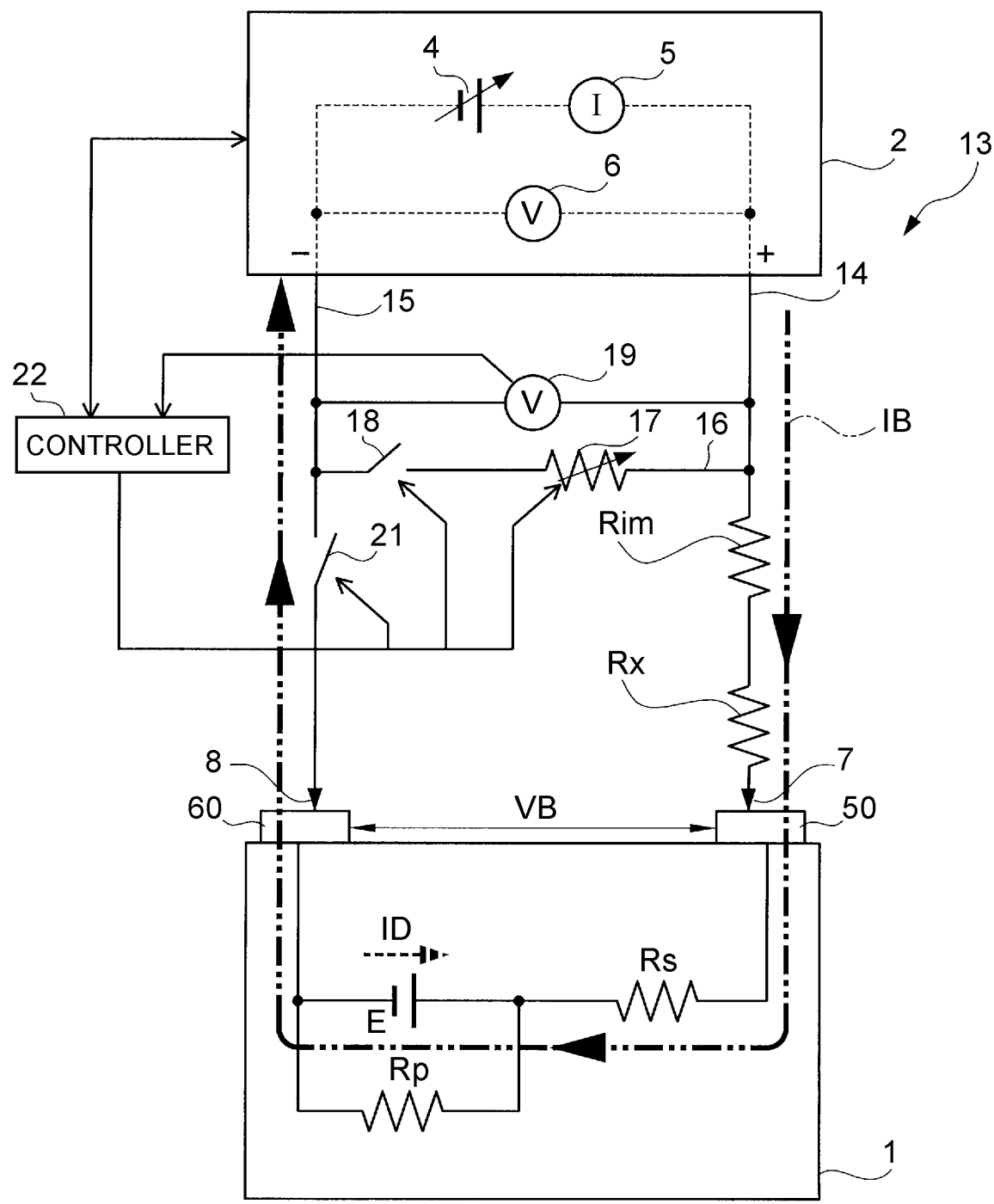
FIG. 1 is a circuit diagram illustrating the configuration of an inspection apparatus in an embodiment.

Hereinafter, an embodiment of the present disclosure will be described in detail with reference to the accompanying drawings. The present embodiment embodies the present disclosure as an inspection apparatus 13 illustrated in the circuit diagram of FIG. 1. The inspection apparatus 13 of FIG. 1 has a power supply device 2, a positive conductive line 14, a negative conductive line 15, and a resistance path 16. The positive conductive line 14 and the negative conductive line 15 are connected to a positive terminal and a negative terminal of the power supply device 2, respectively. The positive conductive line 14 and the negative conductive line 15 have probes (a first probe, a second probe) 7, 8 provided at the corresponding front end, respectively. The resistance path 16 is disposed between the positive conductive line 14 and the negative conductive line 15. In the resistance path 16, a resistor 17 and a first switch 18 are disposed in series. The resistor 17 is a variable resistance.

The inspection apparatus 13 further has a voltmeter 19 and a second switch 21. The voltmeter 19 is disposed between the positive conductive line 14 and the negative conductive line 15 in parallel with the resistance path 16. The second switch 21 is disposed at a position closer to the probe 8 than the resistance path 16 in the negative conductive line 15. The power supply device 2 has a direct-current power supply 4, an ammeter 5, a voltmeter 6, and probes 7, 8. The ammeter 5 is disposed in series with the direct-current power supply 4, while the voltmeter 6 is disposed in parallel with the direct-current power supply 4. The direct-current power supply 4 has a variable output voltage VS. The direct-current power supply 4 is used to apply the output voltage VS to the secondary battery 1 in FIG. 1 as described later. The ammeter 5 measures a current flowing to the circuit. The voltmeter 6 measures a voltage across the positive conductive line 14 and the negative conductive line 15. While the voltmeter 19 is out of the power supply device 2, the voltmeter 6 is incorporated in the power supply device 2.

The inspection apparatus 13 further has a controller 22. The controller 22 controls the power supply device 2, reads an indicated value of the voltmeter 19, and operates the resistor 17, the first switch 18, and the second switch 21. The contents of control on the power supply device 2 by the controller 22 includes operation of the direct-current power supply 4, and reading of indicated values of the ammeter 5 and the voltmeter 6.

As illustrated in FIG. 1, inspection of an electrical storage device by the inspection apparatus 13 configured as described before is carried out in the state where a circuit is assembled by connecting the secondary battery 1, that is an electrical storage device to be inspected, to the power supply device 2. First, the basic principle of an inspection method of the secondary battery 1 by the inspection apparatus 13 will be described. In FIG. 1, the probes 7, 8 of the power supply device 2 are coupled with terminals 50, 60 of the secondary battery 1 to constitute a circuit. The circuit in FIG. 1 further includes a parasitic resistance Rx. The parasitic resistance Rx includes a contact resistance between the probes 7, 8 and the terminals 50, 60 in addition to a conductive resistance of each portion of the power supply device 2, the positive conductive line 14, and the negative conductive line 15. In FIG. 1, although the parasitic resistance Rx is illustrated as if the parasitic resistance Rx is present only on the positive side, on the secondary battery 1 side from the resistance path 16 to be specific, this is merely for the sake of convenience. The parasitic resistance Rx is actually distributed over the entire circuit of FIG. 1, including the positive side, the negative side, and the side of the secondary battery 1 and the power supply device 2 from the resistance path 16.

Basic Principle

Figure 2:
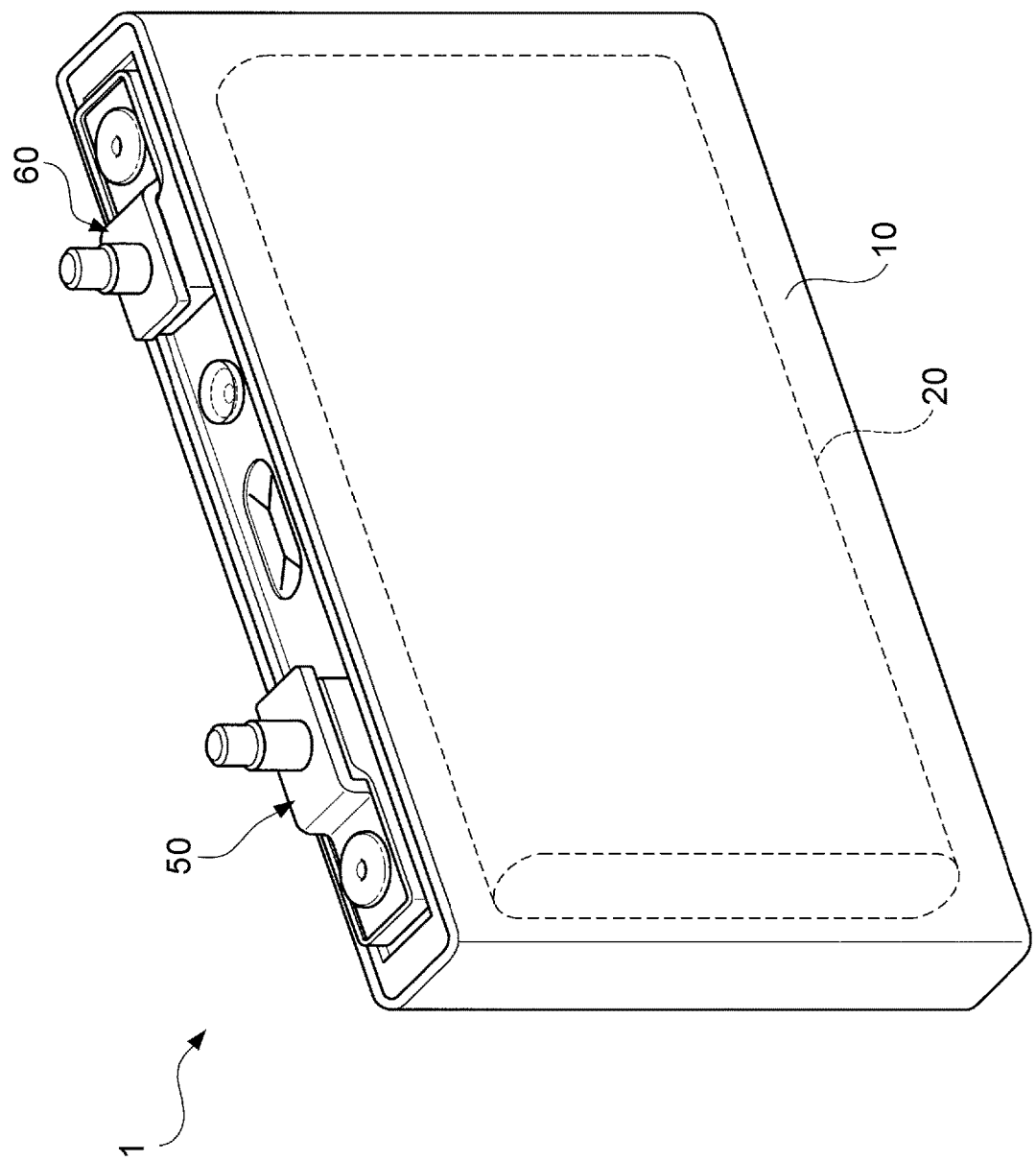
FIG. 2 is an external view illustrating an example of a secondary battery to be inspected in the embodiment.

The secondary battery 1, which is schematically illustrated in FIG. 1, has actually an external appearance in a flat square shape as illustrated in FIG. 2, for example. The secondary battery 1 of FIG. 2 is made of an electrode laminate 20 incorporated in an outer casing 10. The electrode laminate 20 is a laminate of a positive electrode plate and a negative electrode plate with a separator provided therebetween. The outer casing 10 houses an electrolytic solution in addition to the electrode laminate 20. The secondary battery 1 has positive and negative terminals 50, 60 provided on the external surface. Without being limited to the flat square shape as in FIG. 2, the secondary battery 1 may have other shapes such as a cylindrical shape.

The secondary battery 1 will further be described. In FIG. 1, the secondary battery 1 is schematically illustrated. The secondary battery 1 in FIG. 1 is represented as a model including an electromotive element E, an internal resistance Rs, and a short-circuit resistance Rp. The internal resistance Rs is disposed in series with the electromotive element E. The short-circuit resistance Rp models an electric conduction route provided by a minute metal foreign substance which may invade into the electrode laminate 20. The short-circuit resistance Rp is disposed in parallel with the electromotive element E.

In the inspection method with the inspection apparatus 13, the size of a self-discharge amount of the secondary battery 1 is inspected. When the self-discharge amount is large, the secondary battery 1 is defective, whereas when the self-discharge amount is small, the secondary battery 1 is non-defective. Accordingly, first, the secondary battery 1 is charged before being connected with the power supply device 2. Then, the charged secondary battery 1 is connected with the power supply device 2, and in that state, the self-discharge amount of the secondary battery 1 is calculated with the controller 22. Based on the calculation result, the quality of the secondary battery 1 is determined.

Specifically, the charged secondary battery 1 is connected with the power supply device 2. In this case, the charged secondary battery 1 is connected with the power supply device 2 after high-temperature aging, which is normally performed after charging, is completed and the battery voltage is stable. However, the inspection itself of the present embodiment is conducted at room temperature. When the secondary battery 1 is connected with the power supply device 2, the output voltage of the direct-current power supply 4 is first regulated such that a reading value of the ammeter 5 becomes zero. The output voltage VS at this time coincides with an initial battery voltage VB1 that is an initial value of a battery voltage VB of the secondary battery 1.

In this state, the output voltage VS coincides with the initial battery voltage VB1, with the direction of the output voltage VS being opposite to the direction of the battery voltage VB of the secondary battery 1. Accordingly, the voltages negate each other, with the result that a circuit current IB of the circuit becomes zero. The output voltage VS of the power supply device 2 is retained while being maintained constant at the initial battery voltage VB1.

Figure 3:
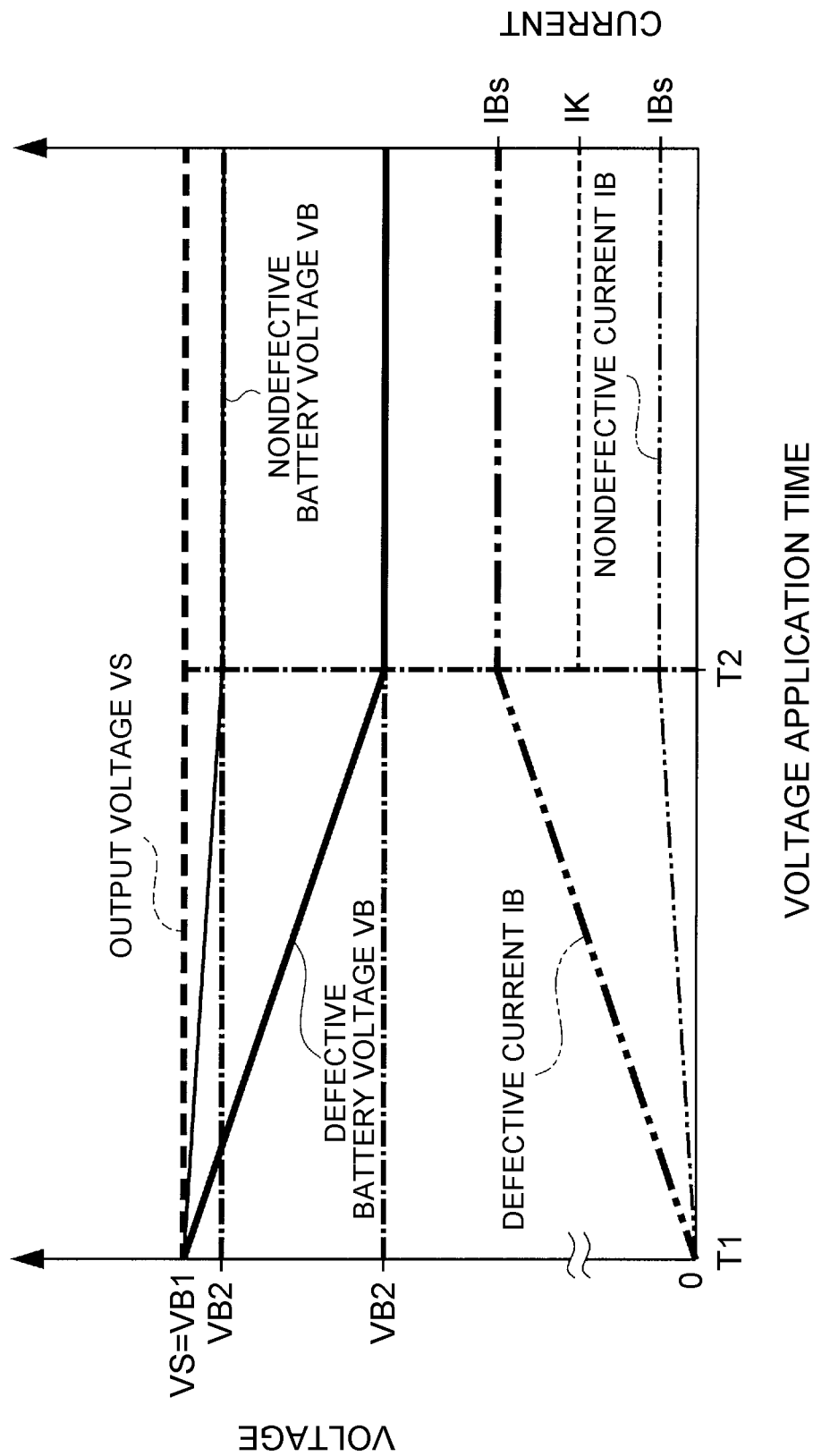
FIG. 3 is a graph view illustrating time-dependent change in voltage and current in an inspection in the embodiment.

The subsequent status of the circuit 3 is illustrated in FIG. 3. In FIG. 3, a horizontal axis represents time, and vertical axes represent a voltage (left side) and a current (right side). With respect to the time expressed by the horizontal axis, time T1 at a left end in FIG. 3 represents timing of starting application of the output voltage VS that is equal to the initial battery voltage VB1 as described before. After time T1, the battery voltage VB gradually drops from the initial battery voltage VB1 due to self-discharge of the secondary battery 1. As a consequence, the balance between the output voltage VS and the battery voltage VB is disrupted, as a result of which the circuit current IB flows into the circuit. The circuit current IB gradually increases from zero. The circuit current IB is directly measured by the ammeter 5. At time T2 after time T1, drop of the battery voltage VB and increase of the circuit current IB are both saturated, and henceforth, both the battery voltage VB and the circuit current IB become constant (VB2, IBs).

As is clear from FIG. 3, increase of the circuit current IB and drop of the battery voltage VB are both steeper in a defective secondary battery 1 than in a non-defective secondary battery 1. Accordingly, the circuit current IBs after convergence in the case of the defective secondary battery 1 is larger than the circuit current IBs after convergence in the case of the non-defective secondary battery 1. The battery voltage VB2 of the defective secondary battery 1 after convergence is lower than the battery voltage VB2 of the non-defective secondary battery 1 after convergence.

The reason why the status of the circuit is as illustrated in FIG. 3 after time T1 will be described. First, the battery voltage VB drops because of self-discharge of the secondary battery 1 as described before. Because of the self-discharge, a self-discharge current ID flows to the electromotive element E of the secondary battery 1. The self-discharge current ID becomes larger as the self-discharge amount of the secondary battery 1 is larger. The self-discharge current ID becomes smaller, as the self-discharge amount of the secondary battery 1 is smaller. The secondary battery 1 in which the value of the short-circuit resistance Rp is small tends to have a larger self-discharge current ID.

Meanwhile, the circuit current IB that flows due to the drop of the battery voltage VB after time T1 is a current passing in the direction of charging the secondary battery 1. That is, the circuit current IB acts in the direction of suppressing the self-discharge of the secondary battery 1, and flows in the direction opposite to the self-discharge current ID within the secondary battery 1. When the circuit current IB increases to the same level as the self-discharge current ID, self-discharge substantially stops. This occurs at time T2. Consequently, after time T2, both the battery voltage VB and the circuit current IB become constant (VB2, IBs). Whether or not the circuit current IB has converged may be determined by a known method. For example, the value of the circuit current IB may be sampled at appropriate frequency, and when a change in value becomes smaller than a preset reference, it may be determined that the circuit current IB has converged.

As stated before, the circuit current IB can directly be obtained as a reading value of the ammeter 5. Accordingly, the quality of the secondary battery 1 can be determined by setting a reference value IK for the circuit current IBs after convergence. When the circuit current IBs after convergence is larger than the reference value IK, it can be determined that the secondary battery 1 is defective with a large self-discharge amount. When the circuit current IBs is smaller than the reference value IK, it can be determined that the secondary battery 1 is non-defective with a small self-discharge amount.

The processing time (time T1 time T2) required in such a determination method is shorter than the retention time in the method described in Summary. Since the method involves current measurement, determination accuracy is high. The quality determination using the battery voltage VB2 after convergence described in FIG. 3 is not very good means. This is because the battery voltage VB is not necessarily presented as a correct reading value of the voltmeter 6. Thus, the basic principle of the inspection method of the secondary battery 1 with the inspection apparatus 13 has been described. In manufacturing the secondary battery 1, an initial charging step of performing initial charging of an assembled uncharged secondary battery 1 to a preset charging state to provide a charged secondary battery 1, and an inspection step of inspecting the charged secondary battery 1 may be performed. In the inspection step, the aforementioned inspection method may be performed.

Hereinbefore, it has been described that the output voltage VS of the direct-current power supply 4 is constant. However, the output voltage VS may not be constant. Rather, the processing time required for determination can further be shortened by properly changing the output voltage VS. This point will be described below.

Figure 4:
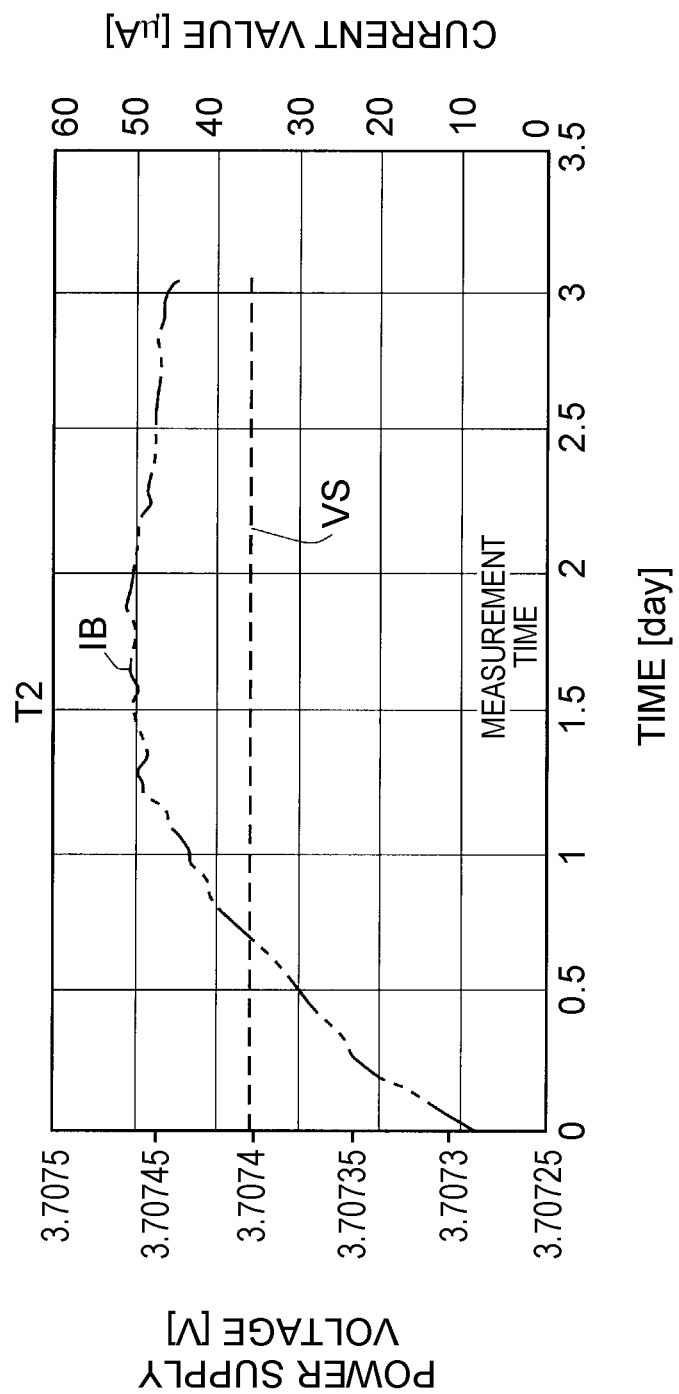
FIG. 4 is a graph view illustrating an example of transition in a circuit current when an output voltage is constant.
Figure 5:
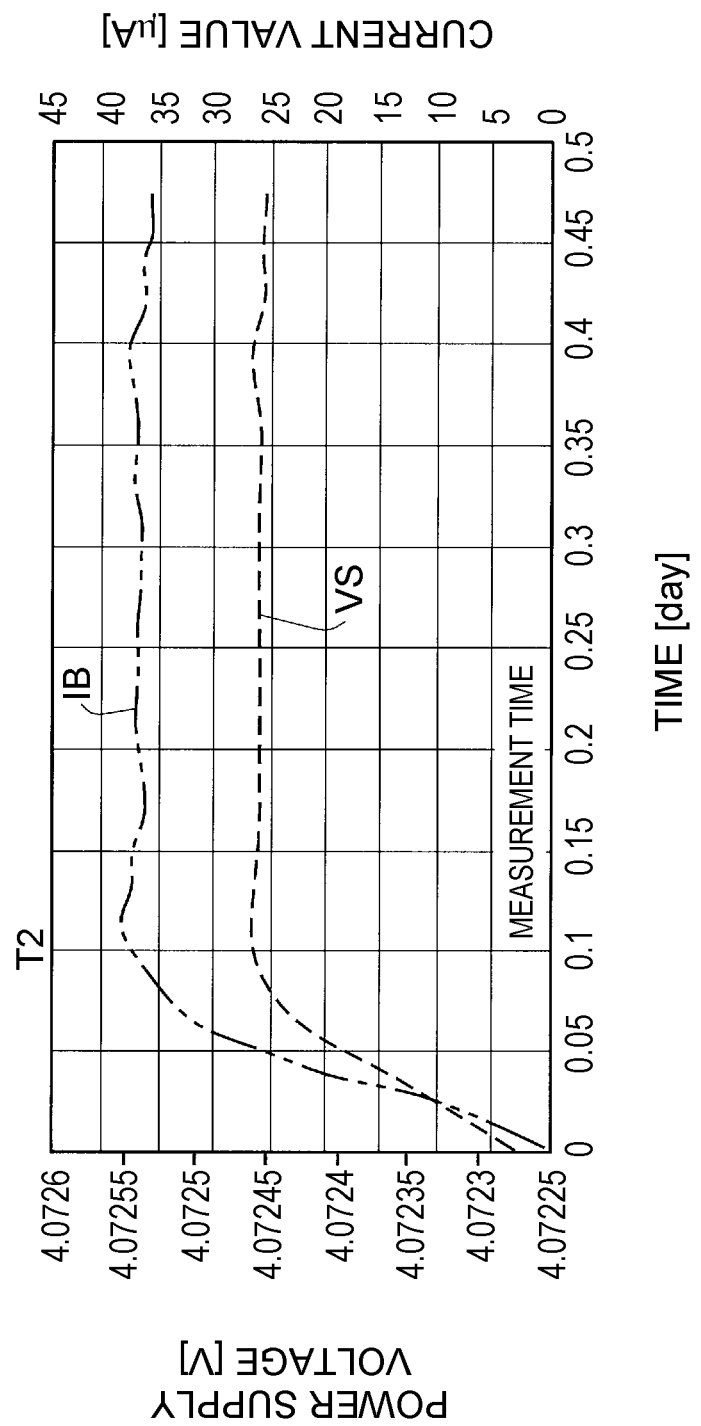
FIG. 5 is a graph view illustrating an example of transition in the circuit current when the output voltage is increased.

With reference to FIGS. 4 and 5, advantages of changing the output voltage VS will be described. FIG. 4 is one example of transition of the actual circuit current IB when the output voltage VS is constant as described before. In the example of FIG. 4, the output voltage VS is unchanged from an initially set value, and it takes about 1.5 days for the circuit current IB to converge (time T2). While the measurement time of 1.5 days in FIG. 4 is sufficiently shorter than that in the case where determination is made based on voltage measurement, the processing time can further be shortened by changing the output voltage VS. FIG. 5 illustrates an example of further reduction in the processing time. In the example of FIG. 5, the output voltage VS is increased and converged only in 0.1 day.

Although measuring conditions themselves are the same in the example of FIG. 4 and the example of FIG. 5, the initial values of the output voltages VS or the circuit currents IB (IBs) after convergence in these examples do not coincide with each other since the secondary batteries 1 to be measured are individually different. In the measurement example of FIG. 5, a non-defective secondary battery 1 is used. The circuit current IB (IBs) after convergence becomes larger than that in FIG. 5 when a defective secondary battery 1 is used instead.

Description is further given of the case of increasing the output voltage VS as in FIG. 5. First, the circuit current IB in the circuit of FIG. 1 is given by a subsequent expression (1) with an output voltage VS of the direct-current power supply 4, a battery voltage VB, and a parasitic resistance Rx:

$$IB=(VS-VB)/Rx \tag{1}$$

When the output voltage VS is constant, the circuit current IB increases as mentioned before due to the drop of the battery voltage VB caused by self-discharge of the secondary battery 1. When the circuit current IB increases to the level equal to the self-discharge current ID, discharge of the secondary battery 1 substantially stops. As a consequence, both the battery voltage VB and the circuit current IB henceforth become constant (VB2, IBs) as described before. That is, the circuit current IBs after convergence indicates the self-discharge current ID of the electromotive element E of the secondary battery 1.

In the case of increasing the output voltage VS, the expression (1) is similarly established. However, the rate of increase in the circuit current IB is higher than that in the case where the output voltage VS is constant, in proportion to the increase of the output voltage VS. Accordingly, the time required until the circuit current IB becomes equal to the self-discharge current ID is shortened. This is the reason why the circuit current IB converges early as mentioned before. However, if the output voltage VS is blindly increased, there is a possibility that the output voltage VS may become too high. If the output voltage VS is too high, the circuit current IB does not appropriately converge, resulting in failure in determination. Accordingly, it is necessary to restrict the level of increase in the output voltage VS. Specifically, in the present embodiment, the output voltage VS is increased within the range where it seems as though the parasitic resistance Rx becomes small in the expression (1). When the parasitic resistance Rx becomes small, the circuit current IB proportionally increases.

Accordingly, in the present embodiment, the concept of a virtual resistance Rim is introduced as illustrated in FIG. 1. The virtual resistance Rim is a virtual resistance having a negative resistance value or a resistance value of zero. In the circuit diagram of FIG. 1, the virtual resistance Rim is introduced in series with the parasitic resistance Rx. Although such resistance is not present in actuality, the situation where the output voltage VS increases is examined by replacing the situation with a model where the absolute value of a resistance value of the virtual resistance Rim increases in place of the output voltage VS that is set to be constant. However, a sum of the parasitic resistance Rx and the virtual resistance Rim needs to be positive though it reduces. Hereinafter, the sum of the parasitic resistance Rx and the virtual resistance Rim is called a pseudo parasitic resistance Ry. The circuit current in the model where the pseudo parasitic resistance Ry is introduced is expressed as a subsequent expression (2):

$$IB=(VS-VB)/(Rx+Rim) \qquad (2)$$

Here, suppose that the parasitic resistance Rx is 5Ω. In that case, the circuit current IB when the virtual resistance Rim is 0Ω is different from the circuit current IB when the virtual resistance Rim is −4Ω. That is, the circuit current IB in the case of −4Ω (equivalent to the resistance after the start of measurement) is five times larger than the circuit current IB in the case of 0Ω (equivalent to the resistance at the start of measurement) according to the expression (2). This is because the pseudo parasitic resistance Ry (=Rx+Rim) decreases to ⅕ of the case where the virtual resistance Rim is 0Ω.

The aforementioned expression (2) may be deformed into a subsequent expression (3):

$$VS=VB+(Rx+Rim)*IB \qquad (3)$$

The expression (3) expresses that the output voltage VS is obtained by adding a product of the pseudo parasitic resistance Ry and the circuit current IB to the battery voltage VB. Since the virtual resistance Rim in the pseudo parasitic resistance Ry is not present in actuality as described before, the expression (3) is established by increasing the output voltage VS up to the voltage obtained by adding the product of the parasitic resistance Rx and the circuit current IB to the battery voltage VB. That is, a value obtained by dividing an increased part of the output voltage VS by the circuit current IB corresponds to the absolute value of the virtual resistance Rim.

In the case where measurement is started with the output voltage VS being coincided with the initial battery voltage VB1 as described before, the output voltage VS is increased in accordance with the circuit current IB at that point of time at appropriate frequency based on the expression (3). The frequency of increasing the output voltage VS is about one time per second, for example. The frequency may not be constant. Hence, the margin of increase of the output voltage VS becomes larger, as the increase in the circuit current IB after the start of inspection is larger. When the increase in the circuit current IB converges, the increase in the output voltage VS also converges. As a consequence, measurement as in FIG. 5 can be implemented.

The margin of increase of the output voltage VS corresponding to an increment of the circuit current IB is a product of the parasitic resistance Rx and the circuit current IB according to the above description. That is, when the margin of increase of the output voltage VS is expressed by ΔVS, the margin of increase ΔVS is given by a subsequent expression (4):

$$\Delta VS=Rx*IB \qquad (4)$$

However, without being limited to the above value, the margin of increase may be a value obtained by multiplying the product of the expression (4) by a positive coefficient K that is less than one. The specific value of the coefficient K may be any value within the aforementioned range, and may be set in advance. That is, the margin of increase ΔVS may be calculated by a subsequent expression (5):

$$\Delta VS=K*Rx*IB \qquad (5)$$

A product of the coefficient K and the parasitic resistance Rx may be obtained as a constant M in advance, and the margin of increase ΔVS of the output voltage VS may be calculated by multiplying the circuit current IB by the constant M. In such a case, the output voltage VS in the middle of inspection may be calculated by a subsequent expression (6):

$$VS=VB+M*IB \qquad (6)$$

From a perspective of converging the increase in the circuit current IB early, it is most effective to use the product of the expression (4) as it is as a margin of increase of the output voltage VS. However, in that case, there may be a situation where the aforementioned pseudo parasitic resistance Ry becomes negative because of the accuracy of the value of the parasitic resistance Rx and other reasons. If such a situation occurs, a change in the circuit current IB diverges, which makes it difficult to perform required measurement. Accordingly, multiplying the coefficient K as described before can reduce the risk of divergence.

The following points may be stated with respect to the coefficient K. When the coefficient K is set to a large value (close to one), the absolute value of the virtual resistance Rim becomes close to the absolute value of the parasitic resistance Rx, and so the pseudo parasitic resistance Ry becomes small. This means that the increase of the output voltage VS is steep. When the increase of the output voltage VS is steep, it can be expected that the circuit current IB can be converged in a short time on the one hand. On the other hand, the risk of divergence increases depending on the accuracy of the parasitic resistance Rx. On the contrary, when the coefficient K is set to a small value (away from one), the pseudo parasitic resistance Ry becomes large, which means that the increase of the output voltage VS is gradual. That is, while it takes a long time to converge the circuit current IB, the risk of divergence is small even with a low accuracy of the parasitic resistance Rx.

Accordingly, in order to actually perform measurement in this control, it is necessary to obtain the value of the parasitic resistance Rx with high accuracy. In the parasitic resistance Rx, a portion of contact resistance between the probes 7, 8 and the terminals 50, 60 is different every time the circuit 3 is assembled. Hence, whenever the probes 7, 8 are applied to the terminals 50, 60, the value of the parasitic resistance Rx is measured. In the inspection apparatus 13 of FIG. 1, the value of the parasitic resistance Rx can accurately be measured.

Measurement 1 of Parasitic Resistance

Description will be given of a first measurement procedure of the parasitic resistance Rx in the inspection apparatus 13 of FIG. 1. The measurement is performed in the state where the probes 7, 8 are contacted with the terminals 50, 60 of the secondary battery 1 to be examined, and the second switch 21 is closed by the controller 22. The output voltage VS of the power supply device 2 is turned off. As for the resistor 17, a variable resistance function is not used here, and the resistance value of the resistor 17 is kept fixed. How to use the variable resistance function of the resistor 17 will be described later.

In short, the first measurement procedure of the parasitic resistance Rx in the inspection apparatus 13 corresponds to acquiring two indicated values of the voltmeters 19: one in the state where the first switch 18 is opened; and the other in the state where the first switch 18 is closed. As a result, the value of the parasitic resistance Rx can be calculated. That is, the value of the parasitic resistance Rx is calculated by a subsequent expression (7):

$$Rx=(V0-V1)*(R1/V1) \qquad (7)$$

R1: Resistance value of the resistor 17
V0: Indicated value of the voltmeter 19 with the first switch 18 being turned off
V1: Indicated value of the voltmeter 19 with the first switch 18 being turned on The expression (7) is derived as shown below. First, when the first switch 18 is turned off, V0 is equal to the battery voltage VB itself of the secondary battery 1. When the first switch 18 is turned on, the circuit current IB in that state is given by a following expression:

$$IB=VB/(R1+Rx)$$

Since V1 is a product of the resistance value R1 of the resistor 17 and the circuit current IB, V1 is expressed as shown below:

$$V1=R1*VB/(R1+Rx)=R1*V0/(R1+Rx)$$

By solving Rx in the above expression, the expression (7) is obtained. Thus, in the present embodiment, the parasitic resistance Rx of the circuit is accurately measured. Further reduction in inspection time can be achieved by inspecting the aforementioned self-discharge amount while the state of contact between the probes 7, 8 and the terminals 50, 60 is maintained without being cancelled after the parasitic resistance Rx is accurately measured. This is because a value as close to one as possible can be used as the aforementioned coefficient K when the virtual resistance Rim is introduced, since the measurement accuracy of the parasitic resistance Rx is high. This makes it possible to increase and converge the output voltage VS, and make a determination early after the start of inspection.

In the above operation, V0, V1 may be measured with use of the voltmeter 6 incorporated in the power supply device 2 instead of the voltmeter 19. That is, if the voltmeter 6 is incorporated in the power supply device 2, it is possible to perform the above-described measurement without the voltmeter 19. Although the output voltage VS of the power supply device 2 is turned off in the above operation, it is not essential to turn off the output voltage VS. Even when the output voltage VS is turned on, measurement may still be performed if the output voltage VS at the time when the first switch 18 is turned off is identical to the output voltage VS at the time when the first switch 18 is turned on. However, in that case, it is better to measure V0, V1 with the voltmeter 19.

Measurement 2 of Parasitic Resistance

Description is given of a second measurement procedure of the parasitic resistance Rx in the inspection apparatus 13 of FIG. 1. This measurement aims at accurate measurement of a component (Rx2) of the parasitic resistance Rx closer to the power supply device 2 than the resistance path 16. That is, the parasitic resistance Rx measured in the aforementioned "Measurement 1" technically refers to only the component (Rx1) closer to the secondary battery 1 than the resistance path 16. However, the contact resistance of the probes 7, 8 that constitute most of the parasitic resistance Rx is included in the component Rx1. Hence, as described before, a substantial effect can be provided even with the measurement of only the component Rx1.

In this second measurement, further reduction in the inspection time is achieved also by accurate measurement of the component Rx2. This measurement is performed in the state where the second switch 21 is fixed in an opened state by the controller 22. The output voltage VS of the power supply device 2 is turned on. The variable resistance function of the resistor 17 is still not used. As in the case of "Measurement 1", the measurement itself includes acquiring two indicated values of the voltmeters 19: one in the state where the first switch 18 is opened; and the other in the state where the first switch 18 is closed. At this time, the output voltage VS is the same. The component Rx2 is similarly calculated by calculation of the expression (7). The parasitic resistance Rx with a still higher accuracy can be obtained by adding the thus-obtained component Rx2 to the measurement result in the aforementioned "Measurement 1".

In this second measurement, the voltmeter 6 is not available for measurement of V0, V1. The measurement of V0, V1 is performed with the voltmeter 19 outside the power supply device 2. The second measurement may be performed in the state where the probes 7, 8 are not connected with the secondary battery 1. It is not necessary to perform the second measurement whenever the probes 7, 8 are connected with the secondary battery 1. The second measurement is designed to deal with variation in the component Rx2 caused by individual difference of the power supply device 2. Hence, once measurement is performed, the measured values are effective thereafter. However, when the positive conductive line 14 or the negative conductive line 15 is replaced with a new component, it is recommended to measure new values.

Here, the effect of accurately measuring the parasitic resistance Rx will be described. As the measurement accuracy of the parasitic resistance Rx is higher, the aforementioned pseudo parasitic resistance Ry can be minimized more. When the virtual resistance Rim is set to a value close to the parasitic resistance Rx in the case where the measurement accuracy of the parasitic resistance Rx is low, there is a risk that an actual pseudo parasitic resistance Ry becomes zero or negative. Such a risk is low when the measurement accuracy of the parasitic resistance Rx is high. That is, as the measurement accuracy of the parasitic resistance Rx is higher, the secondary battery 1 can be inspected in the situation where the virtual resistance Rim is as closer to the parasitic resistance Rx as possible. Thus, the inspection time can be shortened.

Figure 6:
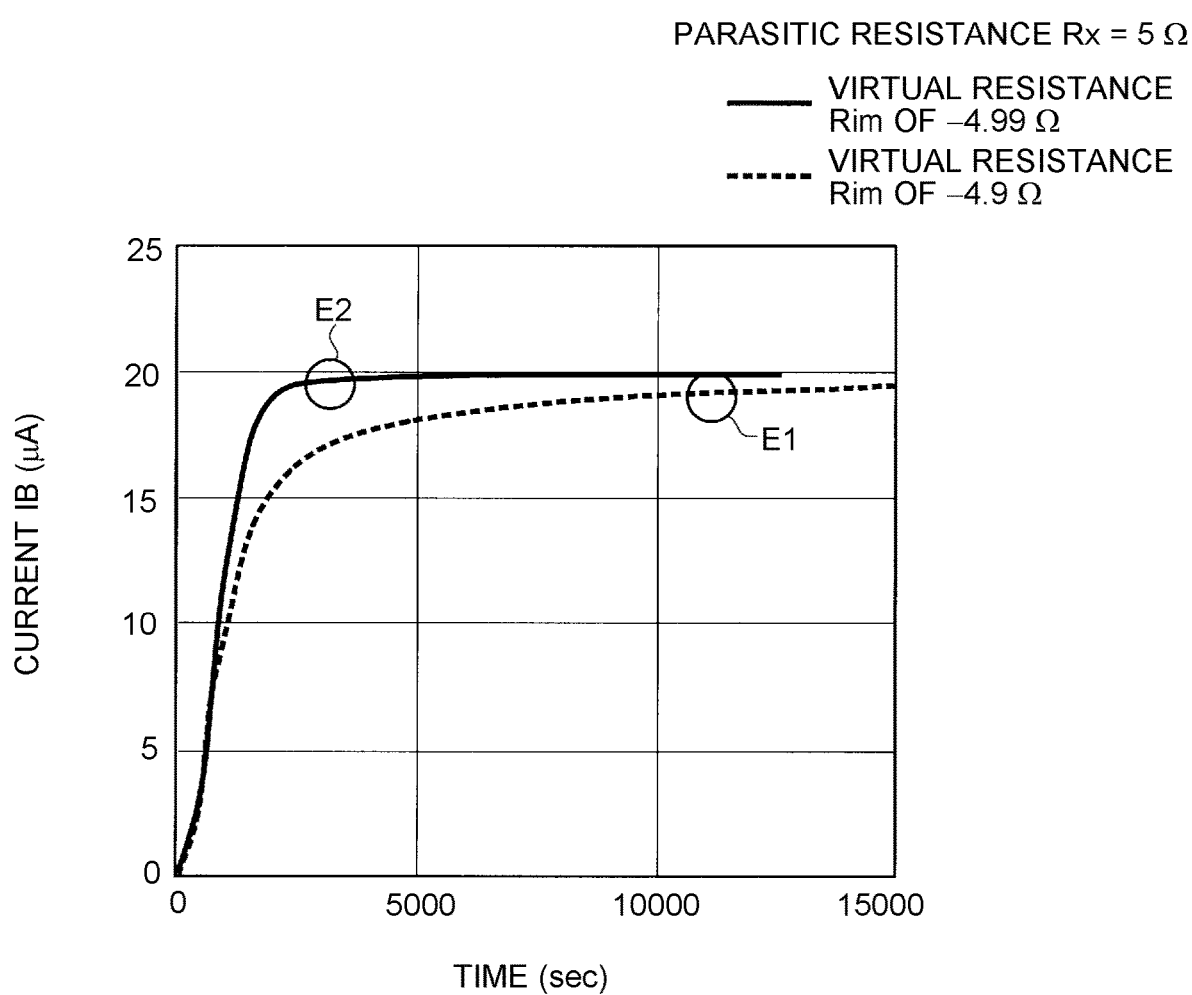
FIG. 6 is a graph view illustrating a difference in a converging state of the circuit current due to virtual resistance.

The graph view of FIG. 6 illustrates the converging state of the circuit current IB after the start of inspection with respect to two reference virtual resistance Rims. The graph view illustrated in FIG. 6 is a measurement example under the following conditions. Type of secondary battery 1: Lithium-ion secondary battery
Storage capacity of secondary battery 1: 35 Ah
Positive-electrode active material: ternary composite lithium salt
Negative-electrode active material: graphite
Electrolyte of electrolytic solution: $LiPF_6$ Solvent of electrolytic solution: carbonate-based mixed solvent of three types
Parasitic resistance Rx: 5 Ω

FIG. 6 presents two graphs: a graph representing a virtual resistance Rim of −4.99Ω (a solid line where the pseudo parasitic resistance Ry is 0.01Ω and the coefficient K is 0.998) and a graph representing a virtual resistance Rim of −4.9Ω (a broken line where the pseudo parasitic resistance Ry is 0.1Ω and the coefficient K is 0.98). First, see the graph of a broken line. The circuit current IB converges in about three hours after the start of inspection (see a round mark designated by E1). It can be said that the circuit current IB converges very quickly as compared with the case where the virtual resistance Rim is not introduced, i.e., the case where the output voltage VS is constant after the start of inspection. The graph of the solid line represents a measurement example obtained in the case where the pseudo parasitic resistance Ry is further decreased. In this case, the circuit current IB converges as short as in about one hour after the start of inspection (see a round mark designated by E2). Thus, the inspection time can be shortened by decreasing the pseudo parasitic resistance Ry.

According to a test conducted by the inventor of the present disclosure, the measurement accuracy of the parasitic resistance Rx by the method of the aforementioned "Measurement 1" was as good as ±10 mΩ or less, and the coefficient K of about "0.98" could satisfactorily be used. Hence, the inspection time was as short as about one hour. The measurement accuracy of the parasitic resistance Rx by using both the methods of "Measurement 1" and "Measurement 2" was as better as ±5 μΩ or less, and the coefficient K of about "0.998" could satisfactorily be used. Hence, the inspection time was still as shorter as about 0.5 hour.

Variable Resistance Function of Resistor 17

In the description so far, the resistance value R1 of the resistor 17 is not discussed. However, further reduction in the inspection time can actually be achieved by optimum setting of the resistance value R1 of the resistor 17. An optimum resistance value R1 of the resistor 17 is dependent on the storage capacity of the secondary battery 1. This will be described below with reference to FIGS. 7 and 8.

Figure 7:
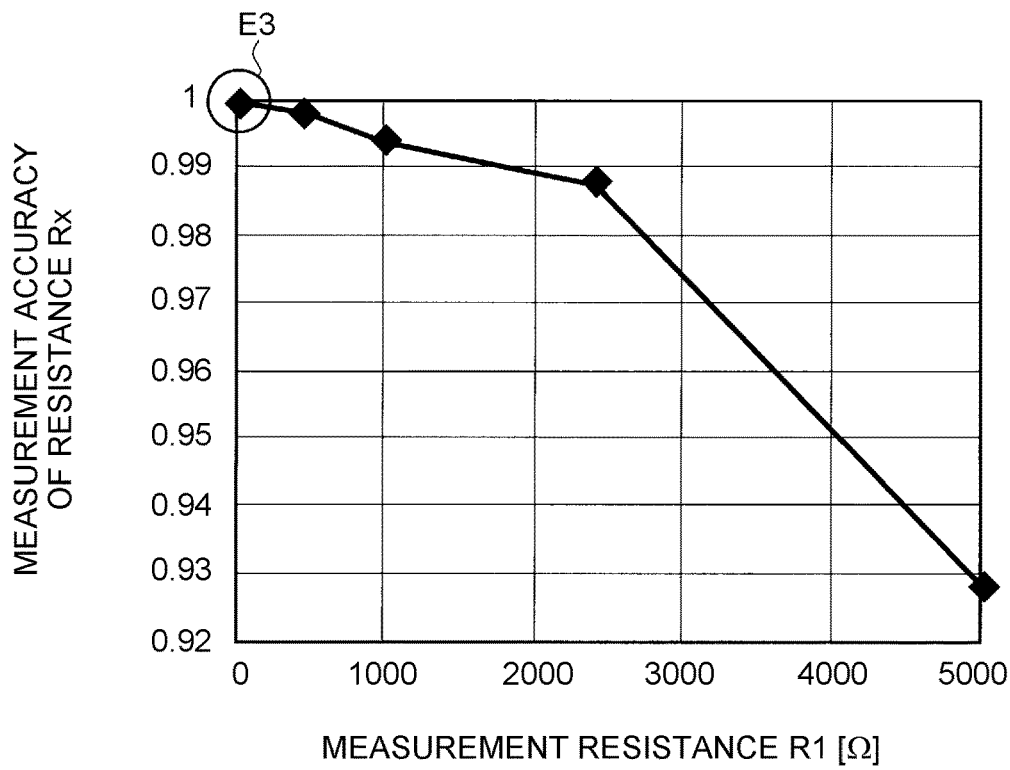
FIG. 7 is a graph view illustrating a relationship between a resistance value of the resistance path and parasitic resistance measurement accuracy.

FIG. 7 is a graph view illustrating the accuracy of the parasitic resistance Rx (component Rx1 to be specific) calculated by the above method of "Measurement 1" when the resistance value R1 is varied. As is clear from FIG. 7, the measurement accuracy is lower as the resistance value R1 is larger. This is attributed to the fact that the parasitic resistance Rx is as small as about several dozen SI. When the first switch 18 is turned on and the voltage V1 is measured in "Measurement 1", the parasitic resistance Rx and the resistor 17 (resistance value R1) are in a series connection state. Accordingly, the circuit current IB in this state is determined by the sum of the parasitic resistance Rx and the resistance value R1. As illustrated in FIG. 7, in the setting where the resistance value R1 increases up to about several thousand SI, the circuit current IB is generally determined by the resistance value R1. Hence, in such setting, the degree of control over the voltage V1 by the parasitic resistance Rx is low, and so the measurement accuracy of the parasitic resistance Rx is also low. On the left side in FIG. 7, that is, in the case where the resistance value R1 is low, the degree of control over the voltage V1 by the parasitic resistance Rx is relatively high, and so the measurement accuracy is also high.

However, a lower resistance value R1 is not necessarily better. An area designated by the round mark E3 at the upper left corner in FIG. 7 is enlarged and illustrated in FIG. 8. As illustrated by an arrow E4 in FIG. 8, when the resistance value R1 is extremely low, the measurement accuracy conversely decreases. This is because when the first switch 18 is turned on with the resistance value R1 being extremely low, the state equivalent to a short-circuit across both the terminals of the secondary battery 1 occurs. Hence, a large circuit current IB flows, with the result that the voltage VB of the secondary battery 1 itself drops. Therefore, highly accurate measurement is not provided after all.

Figure 8:
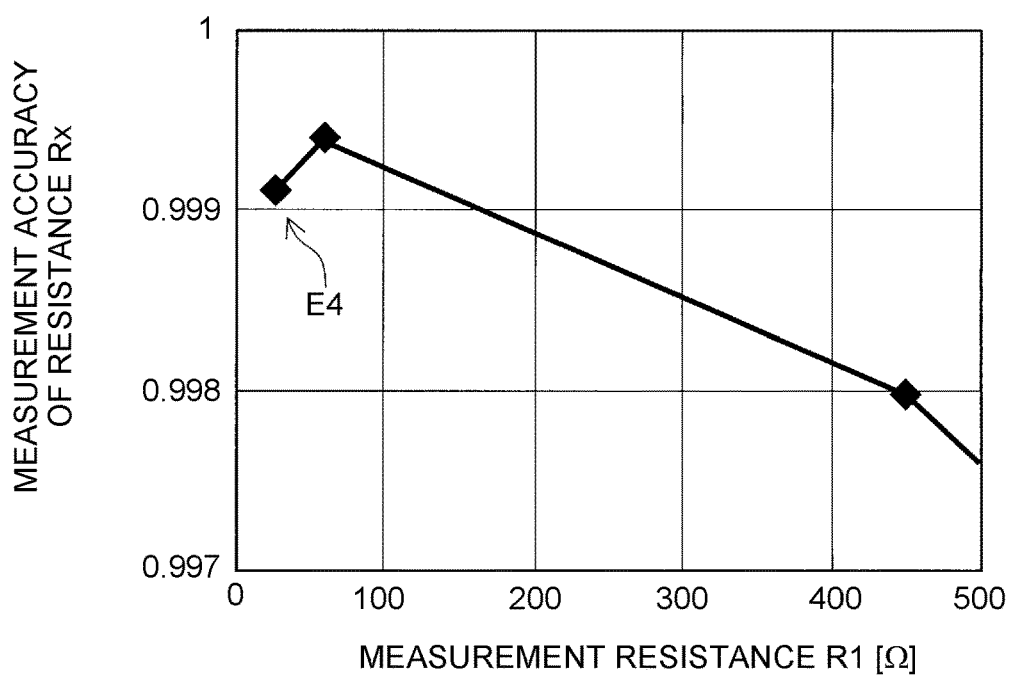
FIG. 8 is a graph view illustrating an enlarge part of FIG. 7.

In FIG. 8, the measurement accuracy is maximum when the resistance value R1 is about 50Ω to 70Ω. Thus, it can be said that the resistance value R1 that maximizes the measurement accuracy is an optimum resistance value R1 of the resistor 17. The influence by a large current in such an extremely low resistance region as describe above is more apparent as the storage capacity of the secondary battery 1 is smaller. The influence is less apparent as the storage capacity is larger. Accordingly, the optimum resistance value R1 of the resistor is different depending on the storage capacity of the secondary battery 1. That is, the optimum resistance value R1 is larger as the storage capacity is smaller, whereas the optimum resistance value R1 is smaller as the storage capacity is larger.

Therefore, the resistance value R1 of the resistor 17 that is a variable resistance is set in accordance with the storage capacity of the secondary battery 1 to be examined. By performing the method of "Measurement 1" in such setting, higher measurement accuracy about the parasitic resistance Rx is achieved. Accordingly, the storage capacity of the secondary battery 1 itself is not required to be very highly accurate. It is sufficient for the secondary battery 1 to have a standard storage capacity value specified by the specifications of the secondary battery 1, and it is not necessary to take an individual difference into consideration. Specifically, the resistance value R1 to be set may be stored in advance for each of the specifications of the secondary batteries 1 that may be inspected. The controller 22 sets the resistance value R1 of the resistor 17 in accordance with the specifications of the intended secondary battery 1 to be examined. The resistor 17 mounted on the inspection apparatus 13 of FIG. 1 may not have a wide variable range including a high resistance region as illustrated in FIG. 7. It is sufficient if the resistor 17 covers about several Ω to several hundred Ω.

When the resistance value R1 is determined as described above, the determined resistance value R1 may be reflected upon the virtual resistance Rim at the time of measuring convergence of the circuit current IB. That is, as the determined resistance value R1 is lower, the virtual resistance Rim can be set to a value closer to the parasitic resistance Rx. This is because as the determined resistance value R1 is lower, the measurement accuracy of the parasitic resistance Rx is higher. The reason is as stated in the description of FIG. 7 before. Therefore, as the resistance value R1 is lower, the aforementioned coefficient K for the virtual resistance Rim can be set larger (closer to one). That is, the inspection time can be shortened more, as the storage capacity of the secondary battery 1 is larger.

Specifically, the resistance value R1 to be set for the resistor 17 may be specified in advance, for each of the specifications of the secondary batteries 1 to be examined, in accordance with the storage capacity on the specifications. The resistance value R1, specified in accordance with the specifications of the intended secondary battery 1 to be examined, may be set for the resistor 17. Thus, the parasitic resistance Rx can be measured in the optimum resistance setting corresponding to the specifications of the intended secondary battery 1, and an inspection can be performed in a very short time.

The steps of the inspection in the inspection apparatus 13 of the present embodiment as described in the foregoing may be listed in time-series order as below:
<1> Setting of inspection apparatus 13 onto secondary battery 1 to be examined
<2> Determination of initial current value
<3> Measurement 2 of Parasitic Resistance
<4> Setting of resistance value R1
<5> Measurement 1 of Parasitic Resistance
<6> Setting of virtual resistance Rim
<7> Measurement of self-discharge Among these steps, step <2> of "Determination of initial current value" relates to determining the value of the circuit current IB at time T1 in the graph view of FIG. 3, that is, determining the value of the circuit current IB at the time of starting measurement of self-discharge. In the description of the graph view of FIG. 3, the current value starts at zero as it is the easiest to understand. However, it is possible to cause a certain amount of current to flow from the beginning instead. In this step, this initial current value is determined. Here, subsequent description will be made on the assumption that the current starts at zero.

In step <3> of "Measurement 2 of parasitic resistance", the component Rx2 of the parasitic resistance Rx on the side of the power supply device 2 is measured in the state where the second switch 21 is opened as described before. Step <4> of "Setting of resistance value R1", the resistance value R1 of the resistor 17 is set in accordance with the specifications of the secondary battery 1 to be examined. Step <4> may be performed at any time as long as it is before step <5>. In step <5> of "Measurement 1 of parasitic resistance", the second switch 21 is closed, and the component Rx1 that constitutes most of the parasitic resistance Rx is measured. At this time, the terminals 50, 60 of the secondary battery 1 should naturally be connected to the probes 7, 8. After step <5>, the process up to step <7> of "Self-discharge measurement" should be performed with the probes 7, 8 being connected to the terminals 50, 60. In step <6> for "setting of virtual resistance Rim", the level of increasing the output voltage VS in "self-discharge measurement" is set by setting the coefficient K as described above.

According to the present embodiment as described in detail in the foregoing, in the inspection apparatus 13 that inspects the quality of the secondary battery 1 by measurement of self-discharge, the resistance path 16 configured by serially connecting the resistor 17 and the first switch 18 is disposed between the positive conductive line 14 and the negative conductive line 15. Hence, two voltages V0, V1 when the first switch 18 is turned on and when the first switch 18 is turned off can be obtained in the state where the secondary battery 1 to be examined is connected to the inspection apparatus 13. This makes it possible to achieve high-accuracy measurement of the parasitic resistance Rx of a circuit including the contact resistance of the probes 7, 8.

The inspection apparatus 13 also includes the second switch 21 such that two voltages can similarly be acquired on the power supply device 2 side. This makes it possible to measure the parasitic resistance Rx of the circuit with higher accuracy. Furthermore, a variable resistance is used as the resistor 17 to make it possible to measure the parasitic resistance Rx with higher accuracy. Thus, after the parasitic resistance Rx is obtained with extremely high accuracy, self-discharge inspection is performed. Accordingly, it is possible to converge the circuit current IB in a very short time and complete the quality inspection of the secondary battery 1, while suppressing the risk of divergence of the circuit current IB to limits. Thus, the inspection apparatus 13 that can swiftly perform the quality inspection of the secondary battery 1, regardless of variation in the parasitic resistance Rx based on various factors, is implemented.

The present embodiment is in all respects illustrative and is not considered as the basis for restrictive interpretation. Therefore, the present disclosure can naturally make various modifications and improvements without departing from the scope of the present disclosure. For example, in the embodiment, although the second switch 21 is provided in the negative conductive line 15, the second switch 21 may be provided in a location closer to the probe 8 than the resistance path 16 in the positive conductive line 14. The sequential order of the resistor 17 and the first switch 18 in the resistance path 16 may be any order. The first switch 18 and the second switch 21 may be of any type, such as an analog switch, or a semiconductor switch.

The inspection method of the present embodiment can be performed not only for the secondary batteries immediately after being manufactured as new articles but also for second-hand secondary batteries for such a purpose as remanufacturing of used assembled batteries, for example. The inspection method of the present embodiment can be performed not only for single unit secondary batteries, but also for parallel-combinations of a plurality of secondary batteries. However, in the case of the parallel-combination, the storage capacity is the storage capacity of the entire parallel-combination. The quality inspection is performed only on the entire parallel-combination, and therefore the quality inspection of the respective secondary batteries are not performed. The electrical storage devices to be determined are not limited to secondary batteries, but may be capacitors, such as electrical double layer capacitors, and lithium ion capacitors.

What is claimed is:

1. An inspection apparatus of an electrical storage device, comprising:
   a power supply device configured to function as an external power supply;
   a positive conductive line connected to a positive electrode terminal of the power supply device to constitute part of a circuit, the positive conductive line having a first probe provided at a front end of the positive conductive line to have a contact with the electrical storage device;
   a negative conductive line connected to a negative electrode terminal of the power supply device to constitute part of the circuit, the negative conductive line having a second probe provided at a front end of the negative conductive line to have a contact with the electrical storage device;
   a resistance path configured by serially connecting a resistor and a switch, the resistance path disposed between the positive conductive line and the negative conductive line;
   a circuit resistance calculation unit configured to calculate a circuit resistance value of the circuit based on a difference in voltage across the positive conductive line and the negative conductive line between when the switch is turned off and when the switch is turned on, in a state where the circuit is constituted by contacting the first probe and the second probe with the positive electrode terminal and negative electrode terminal of the electrical storage device to be examined, respectively;

an inspection unit configured to inspect the electrical storage device while increasing an output voltage of the power supply device in a state where the circuit is constituted and the switch is turned off, so as to inspect an amount of a self-discharge electric current of the electrical storage device based on a converging state of an electric current of the circuit; and a virtual resistance setting unit configured to increase the output voltage of the power supply device after start of inspection within a range where a sum of a virtual resistance value and the circuit resistance value is greater than zero, the virtual resistance value being a negative value obtained by converting an increment of the electric current, related to an increased part of the output voltage of the power supply device when the inspection unit performs the inspection, into a decrement of resistance of the circuit.

2. The inspection apparatus according to claim 1, further comprising:

a second switch provided between the positive conductive line and the first probe or between the resistance path in the negative conductive line and the second probe; and a sub-resistance calculation unit that calculates a sub-resistance value that is a resistance value of a portion constituted of the resistance path, the power supply device, the positive conductive line, and the negative conductive line in the circuit, based on the difference in voltage across the positive conductive line and the negative conductive line between when the switch is turned off and when the switch is turned on in a state where the second switch is turned off, wherein the circuit resistance calculation unit is configured to add the sub-resistance value when calculating the circuit resistance value.

3. The inspection apparatus according to claim 1, wherein the virtual resistance setting unit is configured to set the virtual resistance value such that an absolute value of the virtual resistance value does not exceed the circuit resistance value, and resistance setting unit is configured to change the output voltage of the power supply device to a voltage obtained by adding, to the voltage of the electrical storage device, a value obtained by multiplying the sum of the virtual resistance value and the circuit resistance value by the electric current after the start of the inspection.

4. The inspection apparatus according to claim 1, further comprising a variable resistance setting unit configured to set a resistance value of the resistor to be larger when a storage capacity of the electrical storage device to be inspected is smaller, and sets the resistance value to be smaller when the storage capacity is larger.

5. The inspection apparatus according to claim 4, wherein the virtual resistance setting unit is configured to increase the output voltage of the power supply device after the start of the inspection such that an absolute value of the virtual resistance value is set to be smaller when the resistance value of the resistor set by the variable resistance setting unit is smaller, and the absolute value of the virtual resistance value is set to be larger when the resistance value of the resistor is larger.

* * * * *

UNITED STATES PATENT AND TRADEMARK OFFICE
CERTIFICATE OF CORRECTION

| | | |
|---|---|---|
| PATENT NO. | : 10,884,064 B2 | Page 1 of 1 |
| APPLICATION NO. | : 16/238100 | |
| DATED | : January 5, 2021 | |
| INVENTOR(S) | : Kobayashi et al. | |

It is certified that error appears in the above-identified patent and that said Letters Patent is hereby corrected as shown below:

On the Title Page

Item (73), Assignee; delete "Toyota Jidosha Kabushikt Kaisha, Toyota (JP)" and insert -- Toyota Jidosha Kabushiki Kaisha, Toyota (JP) --

Signed and Sealed this
Eighteenth Day of November, 2025

John A. Squires
*Director of the United States Patent and Trademark Office*